United States Patent
Louie et al.

(10) Patent No.: US 7,123,521 B1
(45) Date of Patent: Oct. 17, 2006

(54) RANDOM CACHE READ

(75) Inventors: Benjamin Louie, Fremont, CA (US); Yunqiu Wan, Mountain View, CA (US); Aaron Yip, Santa Clara, CA (US); Jin-Man Han, Santa Clara, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/115,489

(22) Filed: Apr. 27, 2005

(51) Int. Cl.
*G11C 7/10* (2006.01)
(52) U.S. Cl. .......................... 365/189.05; 365/230.03
(58) Field of Classification Search .......... 365/189.05, 365/230.03; 711/118
See application file for complete search history.

(56) References Cited

U.S. PATENT DOCUMENTS

| | | | |
|---|---|---|---|
| 5,416,739 A * | 5/1995 | Wong | ........................ 711/140 |
| 5,801,996 A | 9/1998 | Seyyedy | |
| 5,813,029 A | 9/1998 | Klein | |
| 5,825,788 A | 10/1998 | Pawlowski | |
| 5,829,036 A | 10/1998 | Klein | |
| 5,835,941 A | 11/1998 | Pawlowski | |
| 5,845,317 A | 12/1998 | Pawlowski | |
| 5,862,154 A | 1/1999 | Pawlowski | |
| 5,953,739 A | 9/1999 | Zagar | |
| 5,960,453 A | 9/1999 | Pawlowski | |
| 5,991,855 A | 11/1999 | Jeddeloh | |
| 6,006,310 A | 12/1999 | Klein | |
| 6,018,792 A | 1/2000 | Jeddeloh | |
| 6,044,433 A | 3/2000 | Zagar | |
| 6,119,197 A | 9/2000 | Klein | |
| 6,172,893 B1 | 1/2001 | Ryan | |
| 6,201,740 B1 | 3/2001 | Seyyedy | |
| 6,219,755 B1 | 4/2001 | Klein | |
| 6,266,796 B1 | 7/2001 | Pawlowski | |
| 6,378,047 B1 | 4/2002 | Meyer | |
| 6,445,636 B1 | 9/2002 | Keeth | |
| 6,460,114 B1 | 10/2002 | Jeddeloh | |
| 6,636,946 B1 | 10/2003 | Jeddeloh | |
| 6,717,857 B1 * | 4/2004 | Byeon et al. | .......... 365/185.21 |
| 6,754,772 B1 | 6/2004 | Crook | |
| 6,757,840 B1 | 6/2004 | Pawlowski | |
| 6,763,420 B1 | 7/2004 | Bentz | |
| 6,779,076 B1 | 8/2004 | Shirley | |
| 6,789,168 B1 | 9/2004 | Jeddeloh | |
| 6,789,169 B1 | 9/2004 | Jeddeloh | |
| 6,862,654 B1 | 3/2005 | Keeth | |
| 6,889,289 B1 | 5/2005 | Crook | |
| 2003/0014588 A1 | 1/2003 | Hu | |
| 2005/0060495 A1* | 3/2005 | Pistoulet | ..................... 711/118 |
| 2005/0080987 A1 | 4/2005 | Zitlaw | |

* cited by examiner

Primary Examiner—Anh Phung
(74) Attorney, Agent, or Firm—Leffert Jay & Polglaze, P.A.

(57) ABSTRACT

A non-volatile memory is described that utilizes a cache read mode of operation, where a next page of memory is being read/sensed from the memory array by the sense amplifiers while a previously read page of memory is being read from the memory I/O buffer, wherein the next page is user selected. This random cache read mode allows for a memory with a random page read capability, in which the address of the next page of data to be read is user selectable, which benefits from the low latency of a cache read mode of operation due to concurrent data sensing and data I/O.

23 Claims, 2 Drawing Sheets

RANDOM CACHE READ

TECHNICAL FIELD OF THE INVENTION

The present invention relates generally to memory devices and in particular the present invention relates to non-volatile memory devices with cache read.

BACKGROUND OF THE INVENTION

Memory devices are typically provided as internal storage areas in a computer. The term memory identifies data storage that comes in the form of integrated circuit chips. There are several different types of memory used in modern electronics, one common type is RAM (random-access memory). RAM is characteristically found in use as main memory in a computer environment. RAM refers to read and write memory; that is, you can both write data into RAM and read data from RAM. This is in contrast to ROM (read-only memory), which permits you only to read data. Most RAM is volatile, which means that it requires a steady flow of electricity to maintain its contents.

Computers almost always contain a small amount of ROM that holds instructions for starting up the computer, typically called a basic input output system (BIOS). Unlike RAM, ROM generally cannot be written to by a user. An EEPROM (electrically erasable programmable read-only memory) is a special type of non-volatile ROM that can be erased and programmed by exposing it to an electrical charge. EEPROM comprise a large number of memory cells having electrically isolated gates (floating gates). Data is stored in the memory cells in the form of charge on the floating gates. Charge is transported to or removed from the floating gates by specialized programming and erase operations.

Yet another type of non-volatile memory is a Flash memory. A Flash memory is a type of EEPROM that can be erased in blocks instead of one byte at a time and reprogrammed. A typical Flash memory comprises a memory array, which includes a large number of memory cells. Each of the memory cells includes a floating gate field-effect transistor capable of holding a charge. The data in a cell is determined by the presence or absence of the charge in the floating gate. The cells are usually grouped into sections called "erase blocks." The memory cells of a Flash memory array are typically arranged into a "NOR" architecture (each cell directly coupled to a bitline) or a "NAND" architecture (cells coupled into "strings" of cells, such that each cell is coupled indirectly to a bitline and requires activating the other cells of the string for access, but allowing for a higher cell density). Each of the cells within an erase block can be electrically programmed in a random basis by charging the floating gate. The charge can be removed from the floating gate by a block erase operation, wherein all floating gate memory cells in the erase block are erased in a single operation. It is noted that other types of non-volatile memory exist which include, but not limited to, Polymer Memory, Ferroelectric Random Access Memory (FeRAM), Ovionics Unified Memory (OUM), Magnetoresistive Random Access Memory (MRAM), Molecular Memory, Nitride Read Only Memory (NROM), and Carbon Nanotube Memory.

A synchronous DRAM (SDRAM) is a type of DRAM that can run at much higher clock speeds than conventional DRAM memory. SDRAM's can be accessed quickly, but are volatile. SDRAM synchronizes itself with a CPU's bus and is capable of running at 100 MHZ, 133 MHZ, 166 MHZ, or 200 MHZ, about three or four times faster than conventional FPM (Fast Page Mode) RAM, and about two to three times as fast EDO (Extended Data Output) DRAM and BEDO (Burst Extended Data Output) DRAM. An extended form of SDRAM that can transfer a data value on the rising and falling edge of the clock signal is called double data rate SDRAM (DDR SDRAM, or simply, DDR). Other forms of synchronous memory interfaces are also utilized in modern memories and memory systems, including, but not limited to, double data rate 2 SDRAM (DDR2), graphics double data rate (GDDR), graphics double data rate 2 (GDDR2), and Rambus DRAM (RDRAM).

Many computer systems are designed to operate using one or more forms of synchronous DRAM, but would benefit from non-volatile memory. A synchronous Flash memory has been designed that allows for a non-volatile memory device with an SDRAM interface. Although knowledge of the function and internal structure of a synchronous Flash memory is not essential to understanding the present invention, a detailed discussion is included in U.S. patent application Ser. No. 09/627,682 filed Jul. 28, 2000 and titled, "Synchronous Flash Memory," which is commonly assigned.

Read operations in many memory types typically include the steps of receiving a read command, receiving the requested address on the address lines of the memory device, decoding the requested memory address to select the desired page of memory cells from the array, waiting until the data from the selected page of memory cells is read from the bit lines that couple the data from the array to sense amplifiers, latching the page of read data from the sense amplifiers to an I/O buffer, and transferring the read data from the memory device. To speed up memory read operations, many memory types, in particular non-volatile memory types, include a cache read mode of operation. In a cache read operation, to reduce the overall latency of a read operation, the next page of data is read from the array by the sense amplifiers while the current page is being transferred from the device so that it will be ready to be latched into the I/O buffer once the current page of data is finished being transferred from the memory. The data read from the next page by the sense amplifiers is typically stored in a data cache latch. This allows the latency of the data sensing of the next page of data by the sense amplifiers and the data I/O of data words from the current page of data to run concurrently. In a cache read operation, the user only sees a full latency read operation for the initial page of data, while each following page of data is sensed concurrently with the I/O of the previous page.

The cache read operation, however, only allows for the current address to be incremented and the next sequential page of data to be sensed and read from the memory. If another page of data that is non-sequentially addressed is desired to read, the cache read operation must be terminated and a new read operation started with a new address. For each new non-sequential read operation the user must wait the full latency period of a standard/initial page read operation.

For the reasons stated above, and for other reasons stated below which will become apparent to those skilled in the art upon reading and understanding the present specification, there is a need in the art for a memory, and in particular a non-volatile memory, with a reduced cache read mode latency.

SUMMARY

The above-mentioned problems with cache read operation in volatile/non-volatile memories and other problems are addressed by the present invention and will be understood by reading and studying the following specification.

The various embodiments relate to volatile and non-volatile memory devices that utilize a random cache read mode of operation which allows the next page of memory being read/sensed from the memory array by the sense amplifiers while the current page is being transferred from the memory I/O buffer to be non-sequential and selected by the user. This allows for random page read capability without losing the low latency benefits of the concurrent sensing-data I/O of a cache read mode of operation, allowing the address of the next page of data to be read to be user selectable.

For one embodiment, the invention provides a memory device comprising an array of memory cells, control circuitry for controlling access to the array of memory cells, wherein the control circuitry is adapted to allow sensing of first data values for a first group of memory cells in response to receiving a first read command and a first address and to allow sensing of second data values for a second group of memory cells in response to receiving a second read command and a second address, the sensing of second data values to occur concurrently with providing the first data values to DQ lines of the memory device, and wherein the control circuitry is further adapted to permit the second address to be non-sequential with the first address.

For another embodiment, the invention provides a non-volatile memory device comprising a non-volatile memory array containing a plurality of memory pages each having a plurality of non-volatile memory cells, a plurality of sense amplifiers, an I/O buffer, a memory interface, and a controller coupled to the non-volatile memory array, the I/O buffer, and the memory interface, wherein the controller is adapted to access pages of memory from the memory array in a cache read mode of operation with a user-selectable cache read, wherein a next memory page is sensed from the non-volatile memory array by the plurality of sense amplifiers while data of a current memory page is transferred from the I/O buffer through the memory interface of the non-volatile memory device and where the next memory page is selected by an address input on the memory interface.

For yet another embodiment, the invention provides a system comprising a processor coupled to a non-volatile memory device, wherein the system is adapted to access pages of memory from the non-volatile memory device in a cache read mode of operation with a user-selectable cache read, and wherein the non-volatile memory device is adapted to read a next memory page from an array of the non-volatile memory device while data of a current memory page is transferred from the non-volatile memory device through a memory interface and where the next memory page is selected by an address input on the memory interface.

For a further embodiment, the invention provides a method of operating a memory device comprising sensing first data values for a first group of memory cells in response to receiving a first read command and a first address, sensing second data values for a second group of memory cells in response to receiving a second read command and a second address, wherein sensing of the second data values occurs concurrently with providing the first data values to DQ lines of the memory device, and wherein the first address and the second address are each selectable by an external processor.

For yet a further embodiment, the invention provides a method of operating a non-volatile memory comprising receiving a first read command and a first address at an interface of a non-volatile memory device, sensing a first memory page of the first read command from a memory array of the non-volatile memory device, receiving a second read command and a second address at the interface of the non-volatile memory device, and sensing a second memory page of the second read command from the memory array while transferring data of the first memory page from the memory device.

Further embodiments of the invention include methods and apparatus of varying scope.

DETAILED DESCRIPTION

Figure 1:
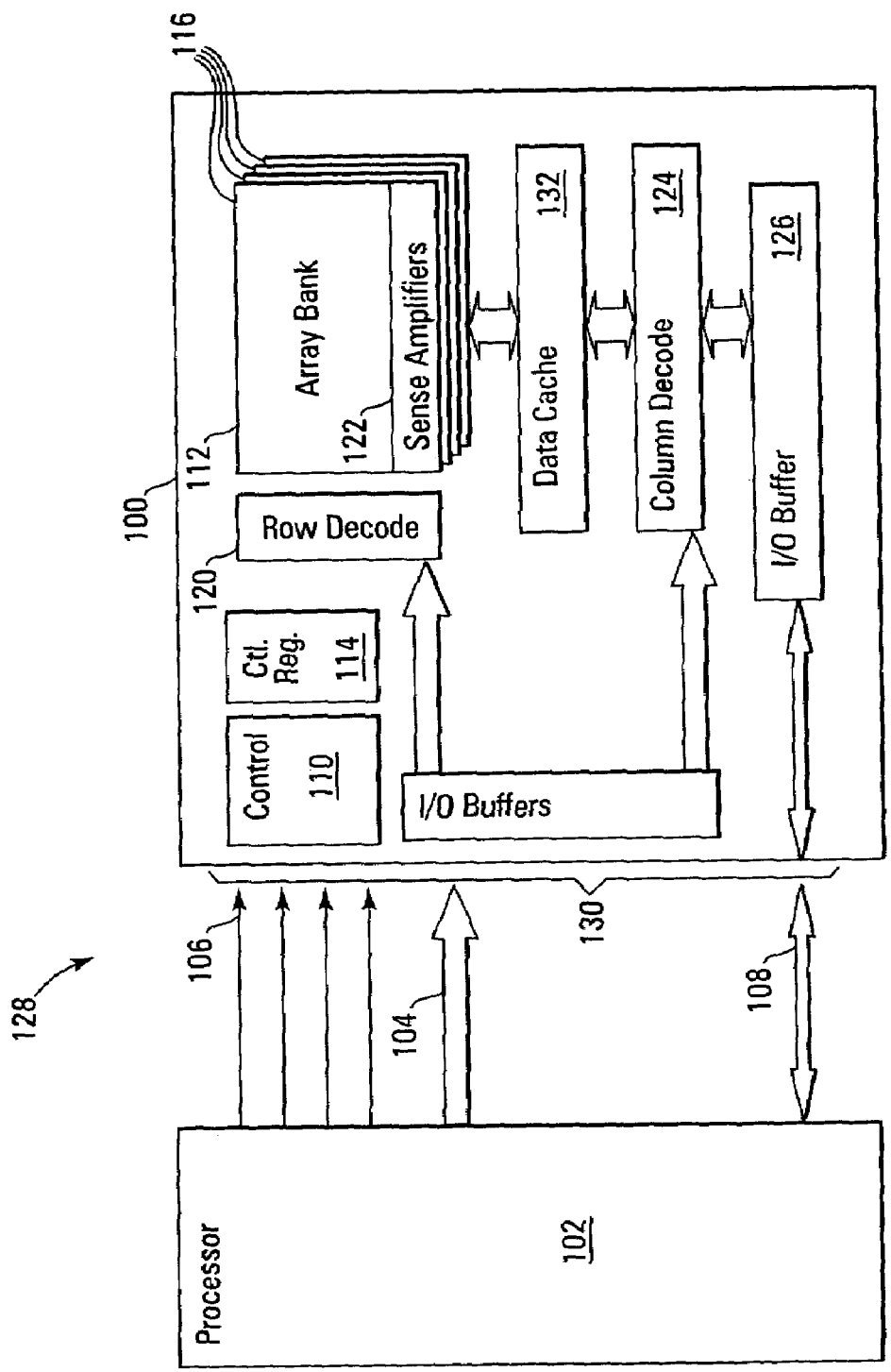
FIG. 1 details simplified block diagram of a system containing a non-volatile memory device in accordance with an embodiment of the present invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Embodiments of the present invention utilize a cache read mode of operation, where a user-selected next page of memory is being read/sensed from the memory array by the sense amplifiers while a previously read page of memory is being transferred from the memory I/O buffer. This random cache read mode allows for non-volatile memory with a page read capability that benefits from the low latency of the concurrent data sensing and data I/O of a cache read mode of operation and yet still allows for the address of the next page of data to be user selectable.

As stated above, a basic read operation/cycle in most memory types typically includes the steps of receiving a read command on the memory interface, which includes the requested address on the address lines, decoding the requested memory address to select the desired page of memory cells from the array, and waiting a specified latency period until the data from the selected page of memory cells is read from the bit lines that couple the data from the array to sense amplifiers. The row/page of data read by the sense amplifiers is then latched into an I/O buffer to be read from the memory device. To speed up memory read operations, many of these memory devices include a cache read mode of operation, wherein the sensing and latching of the next sequential page of data by the sense amplifiers and data cache occurs while the current page of data is being transferred/read from the I/O buffer of the memory device. This concurrent execution of the sensing of the next page of data while transferring the current page of data allows the data transfer rate of the memory device to be increased and the latency of the data sensing of the next page of data by the sense amplifiers to be hidden from the user. In a cache read operation, the user only sees the full latency of a read operation for the initial page of data, with each following page of data being sensed concurrently with the I/O of the previous page.

A conventional cache read operation, however, only allows for the next sequential page of data to be sensed and read from the memory. If another page of data that is non-sequentially addressed is desired to be read, the cache read operation must be terminated and a new read operation started with a new address. For each new non-sequential read operation the user must wait the full latency period of a standard read operation or that of the initial page read of a new cache read operation.

Embodiments of the present invention implement what is termed herein as a random cache read mode operation, wherein the address of next page of data to be read is input to the memory through the interface with the triggering cache read mode command while the current page of data is being read from the I/O buffer of the memory device. In one embodiment of the present invention, this next page of data can be selected from any memory bank of the memory device without restriction.

FIG. 1 shows a simplified diagram of a system 128 incorporating a non-volatile memory device 100 of the present invention coupled to a host 102, which is typically a processing device or memory controller. In one embodiment of the present invention, the non-volatile memory 100 is a NOR architecture Flash memory device or a NAND architecture Flash memory device. It is noted that memory device 100 embodiments of the present invention incorporating other non-volatile memory arrays 112 of differing technology and architecture types (including, but not limited to, Polymer memory, FeRAM, OUM, MRAM, Molecular memory, and Carbon Nanotube memory) are also possible and should be apparent to those skilled in the art with the benefit of the present disclosure. The non-volatile memory device 100 has an interface 130 that contains an address interface 104, control interface 106, and data interface 108 that are each coupled to the processing device 102 to allow memory read and write accesses. It is noted that other memory interfaces 130 that can be utilized with embodiments of the present invention exist, such as a combined address/data bus, and will be apparent to those skilled in the art with the benefit of the present disclosure. In one embodiment of the present invention, the interface 130 is a synchronous memory interface. Internal to the non-volatile memory device, an internal memory controller 110 directs the internal operation; managing the non-volatile memory array 112 and updating RAM control registers and non-volatile erase block management registers 114. The RAM control registers and tables 114 are utilized by the internal memory controller 110 during operation of the non-volatile memory device 100. The non-volatile memory array 112 contains a sequence of memory banks or segments 116. Each bank 116 is organized logically into a series of erase blocks (not shown). Memory access addresses are received on the address interface 104 of the non-volatile memory device 100 and divided into a row and column address portions.

On a read access the row address is latched and decoded by row decode circuit 120, which selects and activates a row/page (not shown) of memory cells across a selected memory bank. The bit values encoded in the output of the selected row of memory cells are coupled to a local bitline (not shown) and a global bitline (not shown) and are detected by sense amplifiers 122 associated with the memory bank. The sense amplifiers 122 include a data cache or data latch 132, which latches the sensed data from the sense amplifiers 122 once it has been sensed/read from the physical row/page of the bank 116. In one embodiment of the present invention, this latching of the sensed data into the data cache allows the sense amplifiers to be released to sense the next page of memory. The column address of the access is latched and decoded by the column decode circuit 124. The output of the column decode circuit 124 selects the desired column data from the internal data bus (not shown) that is coupled to the outputs of the data cache 132 holding the data from the individual read sense amplifiers 122 and couples them to an I/O buffer 126 for transfer from the memory device 100 through the data interface 108.

On a write access the row decode circuit 120 selects the row page and column decode circuit 124 selects write sense amplifiers 122. Data values to be written are coupled from the I/O buffer 126 via the internal data bus to the write sense amplifiers 122 selected by the column decode circuit 124 and written to the selected non-volatile memory cells (not shown) of the memory array 112. The written cells are then reselected by the row and column decode circuits 120, 124 and sense amplifiers 122 so that they can be read to verify that the correct values have been programmed into the selected memory cells.

In another memory device 100 embodiment of the present invention, two or more data caches 132 are coupled to the sense amplifiers 122, allowing multiple pages of data to be sensed and cached while data operations are occurring with the I/O buffer 126 (data being read or written to the I/O buffer 126) or a second data read operation to occur and stored in a second data cache 132 while data is read from a first data cache 132. In yet another embodiment of the present invention, one or more data cache circuits 132 are coupled between the output of the column decode circuit 124 and the I/O buffer 126. In further embodiment of the present invention, the output of the column decode circuit 124 selects the desired column data directly from the outputs of the individual read sense amplifiers 122 and couples them to the I/O buffer 126, allowing the data cache 132 to be eliminated. In yet a further embodiment of the present invention, the column decode circuit 124 is placed before the read sense amplifiers 122.

It is noted that other architectures of non-volatile memory devices, systems, external interfaces, and/or manners of coupling the memory controller/host to the non-volatile memory device(s), such as directly coupled individual control busses and signal lines, are possible and will be apparent to those skilled in the art with benefit of the present disclosure.

In a conventional non-volatile memory, such as a Flash memory, during operation the memory takes memory commands that are input over its interface (control lines, address lines, and data lines). The memory commands are typically differentiated/specified by one or more special control line combinations and are accompanied by the address and/or data required to perform the specified command, which are interleaved along with or after the command codes or incorporated as part of the command itself. For example, a conventional read command in a Flash memory begins by a read mode command being indicated to the Flash memory (for example, by a combination of asserted signals on the chip enable (CE#) and command latch enable (CLE), and de-asserted signals on the read enable (RE#) and address latch enable (ALE)). An initial read command byte (00h) is clocked in. An address of the memory row/page to be read is then latched in the address latch of the memory from the address/data bus on the next five following clock cycles, a final read command byte (30h) is then given to the Flash memory to execute the data page read from its memory array. A Ready/Busy signal line (R/B#) is asserted by the Flash memory while it executes the read operation and senses the selected memory row/page. After a latency period, which is governed by the operation of the memory and, in particular, its sense amplifiers, the Ready/Busy signal line is de-asserted by the device and the Read Enable (RE#) line can be utilized to clock bytes of data from the read memory page from the Flash memory device.

A typical cache read command operation begins with a conventional read command sequence to input the starting address of the read and execute the initial read from the memory. Once the initial page is read from the memory array and is latched in the I/O buffer, a cache read command (00h, 31h) is then utilized to signal the memory to read the next sequentially addressed row/page of the memory array with its sense amplifiers while the initial page is read/transferred from the I/O buffer. Each following sequential page is then triggered to be read from the array with the cache read command (00h, 31h) before the row/page currently held in the I/O buffer is transferred from the memory device so that the next sequential page can be sensed while the current page is being transferred. An example sequence would be: Initial Read Command (00h), Address, Final Read Command (30h), Wait for R/B# to go inactive, Initial Read Command (00h), Cache Read Command (31h), Wait for R/B# to go inactive, Transfer data of initial page, Initial Read Command (00h), Cache Read Command (31h), Wait for R/B# to go inactive, Transfer data of next sequential page, Initial Read Command (00h), Cache Read Command (31h), Wait for R/B# to go inactive, Transfer data, etc. In some memory devices, a cache read exit command is required to exit the cache read mode of operation and resume normal memory operation/commands.

A random cache read command sequence of an embodiment of the present invention allows for the input of an address to be read along with the command triggering the next row/page of data to be read from the memory array. In one embodiment of the present invention, once the initial read command is executed and the initial page read from the memory array and latched in the I/O buffer, a specialized cache read command (which includes the address of the next page of data to be read in the random cache read operation—00h, Address, 31h) is then utilized to signal the memory to read the next randomly selected/addressed row/page of the memory array with its sense amplifiers while the initial page is read from the I/O buffer. Each following randomly selectable page is then triggered to be read from the array with the specialized cache read command (for example, 00h, Address, 31h) before/while the row/page currently held in the I/O buffer is transferred from the memory device so that the next page can be sensed while the current page is being transferred. An example sequence would be: Initial Read Command (00h), Address, Final Read Command (30h), Wait for R/B# to go inactive, Initial Read Command (00h), Address, Cache Read Command (31h), Wait for R/B# to go inactive, Transfer data of initial page, Initial Read Command (00h), Address, Cache Read Command (31h), Wait for R/B# to go inactive, Transfer data of next randomly selected page, Initial Read Command (00h), Address, Cache Read Command (31h), Wait for R/B# to go inactive, Transfer data, etc.

Figure 2:
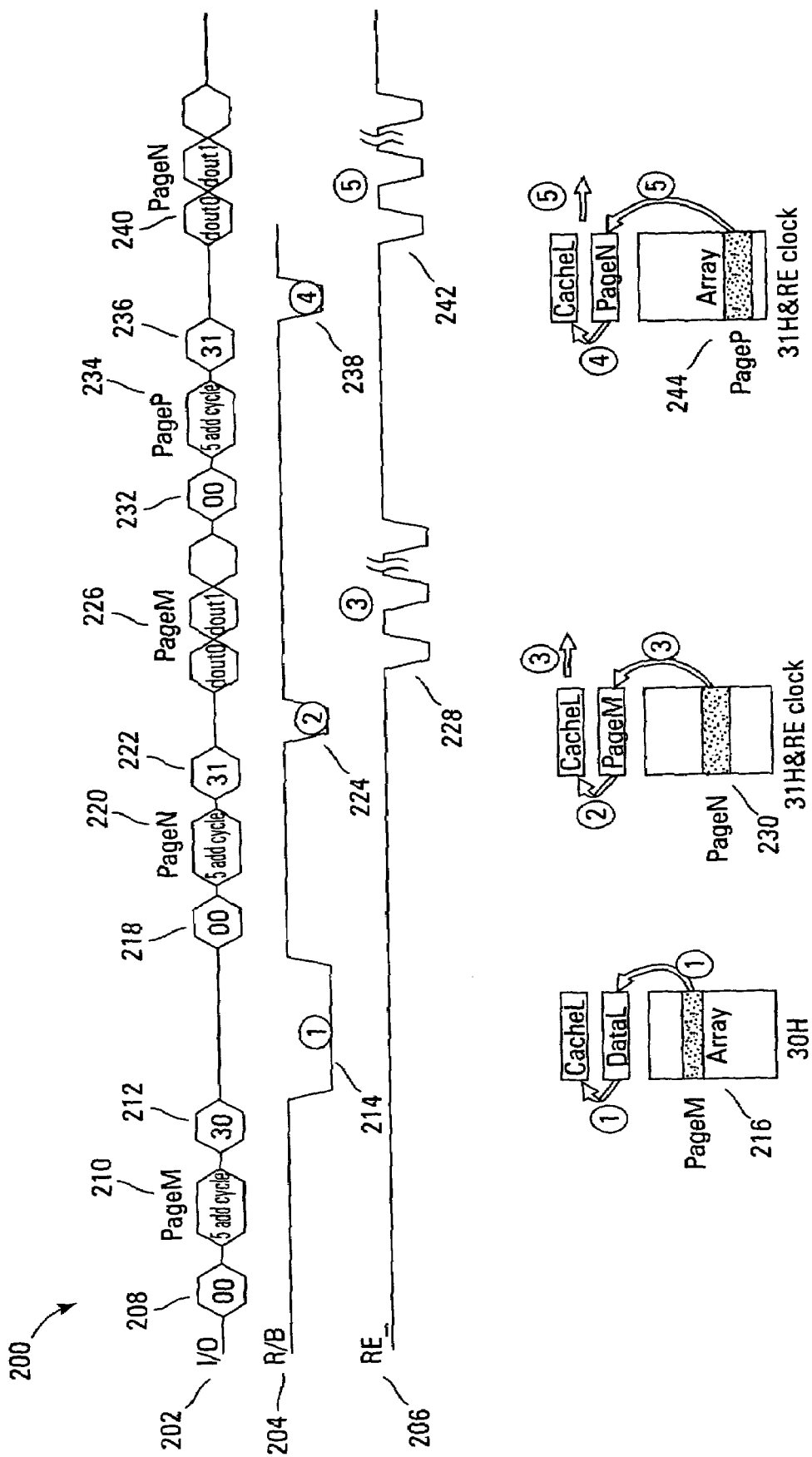
FIG. 2 details a waveform of a random cache read operation of a memory in accordance with an embodiment of the present invention.

FIG. 2 details the waveforms and data movements 200 of rows/pages of data in a random cache read of a memory embodiment of the present invention. In FIG. 2, waveforms are shown for I/O lines 202, Ready/Busy (R/B_) line 204, and Read Enable (RE_) 206 that detail the selection and transfer of random pages of data from a memory device of an embodiment of the present invention. In the command sequence 200, an initial page (Page M) is selected and sensed from the memory array 216 by an Initial Read Command (00h) 208, Address (for Page M) 210, and Final Read Command (30h) 212. After a latency period for Page M to be read by the sense amplifiers of the memory device, the Ready/Busy line is de-asserted 214 by the memory, indicating the page of data (Page M) has been sensed is present in the data cache and/or I/O buffer and is ready to be transferred from the device. At this time a random cache read command and new address are input to the memory device by another Initial Read Command (00h) 218, Address (for Page N) 220, and Cache Read Command (31h) 222, to begin the sensing of the next randomly selected page of data (Page N) 230. Once the R/B_ line is de-asserted 224 after a brief busy interval (while data is latched into the I/O buffer and the new page read (for Page N) initiated on the memory array) the data for the initial page (Page M) is transferred out of the memory device on the I/O lines 226 utilizing the Read Enable (RE_) to clock each data word out 228. A new random cache read command and new address (for Page P) are again input to the memory device by an Initial Read Command (00h) 232, Address (for Page P) 234, and Cache Read Command (31h) 236, to begin the sensing of the next randomly selected page of data (Page P) 244. The R/B_ line is de-asserted 238 and the data from Page N is transferred out of the memory device 240 utilizing the RE_ to clock the data words 242. Additional random cache reads for following memory rows/pages may be added as desired.

It is also noted that other volatile and non-volatile memory embodiments of the present invention incorporating random cache read modes of operation are possible and should be apparent to those skilled in the art with the benefit of the present invention.

CONCLUSION

A non-volatile memory has been described that utilizes a cache read mode of operation, where a next page of memory is being read/sensed from the memory array by the sense amplifiers while a previously read page of memory is being read from the memory I/O buffer, wherein the next page is user selected. This random cache read mode allows for a memory with a random page read capability, in which the address of the next page of data to be read is user selectable, which benefits from the low latency of a cache read mode of operation due to concurrent data sensing and data I/O.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A memory device, comprising:
   an array of memory cells;
   control circuitry for controlling access to the array of memory cells;
   wherein the control circuitry is adapted to allow sensing of first data values for a first group of memory cells in response to receiving a first read command and a first address and to allow sensing of second data values for a second group of memory cells in response to receiving a second read command and a second address, the sensing of second data values to occur concurrently with providing the first data values to DQ lines of the memory device; and wherein the control circuitry is further adapted to permit the second address to be non-sequential with the first address.

2. The memory device of claim 1, wherein the second address is a non-sequential address location from the first address.

3. The memory device of claim 1, wherein the control circuitry is adapted to receive the first read command and first address and sense the first group of memory cells from the array of memory cells and receive the second read command and the second address to sense the second group of memory cells from the memory array while transferring the first data values of the first group of memory cells through the DQ lines of the memory device.

4. The memory device of claim 1, wherein the control circuitry is adapted to receive the first read command and first address and sense the first group of memory cells from the array of memory cells and receive the second read command and the second address to sense the second group of memory cells from the memory array before providing the first data values of the first group of memory cells to the DQ lines of the memory device.

5. The memory device of claim 1, wherein the memory device is one of a volatile memory device and a non-volatile memory device.

6. The memory device of claim 5, wherein the non-volatile memory device is one of a NAND architecture Flash, a NOR architecture Flash, EEPROM, Polymer Memory, Ferroelectric Random Access Memory (FeRAM), Ovionics Unified Memory (OUM), Magnetoresistive Random Access Memory (MRAM), Molecular Memory, Nitride Read Only Memory (NROM), and Carbon Nanotube Memory.

7. The memory device of claim 1, wherein the memory device further comprises a synchronous memory interface.

8. The memory device of claim 7, wherein the synchronous memory interface is one of a SDRAM interface, a DDR interface, a DDR2 interface, GDDR interface, GDDR2 interface, and RDRAM interface.

9. A method of operating a memory device comprising:
sensing first data values for a first group of memory cells in response to receiving a first read command and a first address;
sensing second data values for a second group of memory cells in response to receiving a second read command and a second address;
wherein sensing of the second data values occurs concurrently with providing the first data values to DQ lines of the memory device; and
wherein the first address and the second address are each selectable by an external processor.

10. The method of claim 9, wherein the second read command is a cache read command.

11. The method of claim 9, wherein the second address is a non-sequential address location from the first address.

12. The method of claim 11, wherein the first address is in a first bank of a memory array and the second address is in a second bank of the memory array.

13. The method of claim 9, wherein sensing the first group of memory cells in response to receiving the first read command and first address and sensing the second group of memory cells in response to receiving the second read command and the second address further comprise sensing the first group of memory cells in response to receiving the first read command and first address, receiving the second read command and the second address to sense the second group of memory cells before providing the first data values of the first group of memory cells to the DQ lines of the memory device.

14. The method of claim 9, wherein the memory device is one of a volatile memory device and a non-volatile memory device.

15. The method of claim 14, wherein the non-volatile memory device is one of a NAND architecture Flash, a NOR architecture Flash, EEPROM, Polymer Memory, Ferroelectric Random Access Memory (FeRAM), Ovionics Unified Memory (OUM), Magnetoresistive Random Access Memory (MRAM), Molecular Memory, Nitride Read Only Memory (NROM), and Carbon Nanotube Memory.

16. The method of claim 9, wherein the interface of the memory device is a synchronous memory interface.

17. The method of claim 16, wherein the synchronous memory interface is one of a SDRAM interface, a DDR interface, a DDR2 interface, GDDR interface, GDDR2 interface, and RDRAM interface.

18. A method of operating a non-volatile memory comprising:
receiving a first read command and a first address at an interface of a non-volatile memory device;
sensing a first memory page of the first read command from a memory array of the non-volatile memory device;
receiving a second read command and a second address at the interface of the non-volatile memory device; and
sensing a second memory page of the second read command from the memory array while transferring data of the first memory page from the memory device.

19. The method of claim 18, wherein the second read command is a cache read command.

20. The method of claim 18, wherein the interface of the non-volatile memory device is a synchronous memory interface.

21. A method of reading data from a memory comprising:
sending a first read command and a first address to an interface of a memory device;
waiting while a first memory page of the first read command is sensed from a memory array of the memory device;
sending a second read command and a second address to the interface of the memory device; and
transferring data of the first memory page from the memory device while sensing the second memory page of the second read command from the memory array.

22. The method of claim 21, wherein the second read command is a cache read command.

23. The method of claim 21, wherein the memory interface of the non-volatile memory device is a synchronous memory interface.

* * * * *